US010096787B2

(12) United States Patent
Crowder

(10) Patent No.: US 10,096,787 B2
(45) Date of Patent: Oct. 9, 2018

(54) BIO-SOLAR CELLS

(75) Inventor: Edward Crowder, Wilmington, DE (US)

(73) Assignee: Edward Crowder, Wilmington, DE (US)

( * ) Notice: Subject to any disclaimer, the term of this patent is extended or adjusted under 35 U.S.C. 154(b) by 768 days.

(21) Appl. No.: 13/461,103

(22) Filed: May 1, 2012

(65) Prior Publication Data

US 2012/0279552 A1   Nov. 8, 2012

Related U.S. Application Data

(60) Provisional application No. 61/481,799, filed on May 3, 2011.

(51) Int. Cl.
| | | |
|---|---|---|
| *H01L 51/00* | (2006.01) | |
| *B82Y 10/00* | (2011.01) | |
| *B82Y 30/00* | (2011.01) | |
| *H01L 51/42* | (2006.01) | |

(52) U.S. Cl.
CPC .......... *H01L 51/0093* (2013.01); *B82Y 10/00* (2013.01); *B82Y 30/00* (2013.01); *H01L 51/0049* (2013.01); *H01L 51/424* (2013.01); *H01L 51/0048* (2013.01); *Y02E 10/549* (2013.01)

(58) Field of Classification Search
CPC ............. H01L 51/0048; H01L 51/0093; H01L 51/0049; Y02E 10/549; B82Y 10/00; B82Y 30/00
USPC ........ 136/244, 246, 263; 977/750, 948, 752, 977/742
See application file for complete search history.

(56) References Cited

U.S. PATENT DOCUMENTS

| | | | | |
|---|---|---|---|---|
| 4,081,289 | A * | 3/1978 | Campbell, III | 136/246 |
| 2007/0157967 | A1* | 7/2007 | Mershin et al. | 136/263 |
| 2008/0276987 | A1* | 11/2008 | Flood | 136/256 |
| 2010/0031395 | A1 | 2/2010 | Scherz et al. | |
| 2011/0100463 | A1* | 5/2011 | Elazari | B82Y 10/00 |
| | | | | 136/263 |

FOREIGN PATENT DOCUMENTS

| | | |
|---|---|---|
| WO | WO 2008114249 A1 * | 9/2008 |
| WO | WO 2010132633 A1 * | 11/2010 |

OTHER PUBLICATIONS

Dorogi et al. "Stabilization effect of single-walled carbon nanotubes on the functioning of photosynthetic reaction centers". J. Phys. Chem. B 2006, 110, 21473-21479.*
Quintiliani, et al., "Synthesis and Photoinduced Electron-Transfer Properties of Phthalocyanine-[60] Fullerene Conjugates," Chem Eur. J. 2008, 14, 3765-3775.

(Continued)

*Primary Examiner* — Lindsey A Bernier
(74) *Attorney, Agent, or Firm* — ECSquared

(57) ABSTRACT

A bio-solar cell including: one or more photosynthetic complexes, each photosynthetic complex including one or more chlorophyll compounds and one or more components of Photosystem II; one or more carbon nanotubes upon which the one or more photosynthetic complexes are bound at a first region of the one or more carbon nanotubes; and a conductive substrate attached to a second region of the one or more carbon nanotubes.

24 Claims, 7 Drawing Sheets

(56) References Cited

OTHER PUBLICATIONS

Guldi, D., "Nanometer Scale Carbon Structures for Charge-Transfer Systems and Photovoltaic Applications," Phys. Chem. Chem. Phys., 2007, 9, 1400-1420.
Gooding, et al., "Protein Electrochemistry Using Aligned Carbon Nanotube Arrays," J. Am. Chem. Soc. 2003, 125, 9006-9007.
Carmeli, et al., "A Photosynthetic Reaction Center Covalently Bound to Carbon Nanotubes," Adv. Mater. 2007, 19, 3901-3905.
Ham ,et al., "Photoelectrochemical complexes for solar energy conversion that chemically and autonomously regenerate," Nature Chem. 2010, 2, 929-36.
Choi, et al., "Biomimetic light-harvesting optical nanomaterials," SPIE Newsroom Aug. 19, 2010, 3 pages.

* cited by examiner

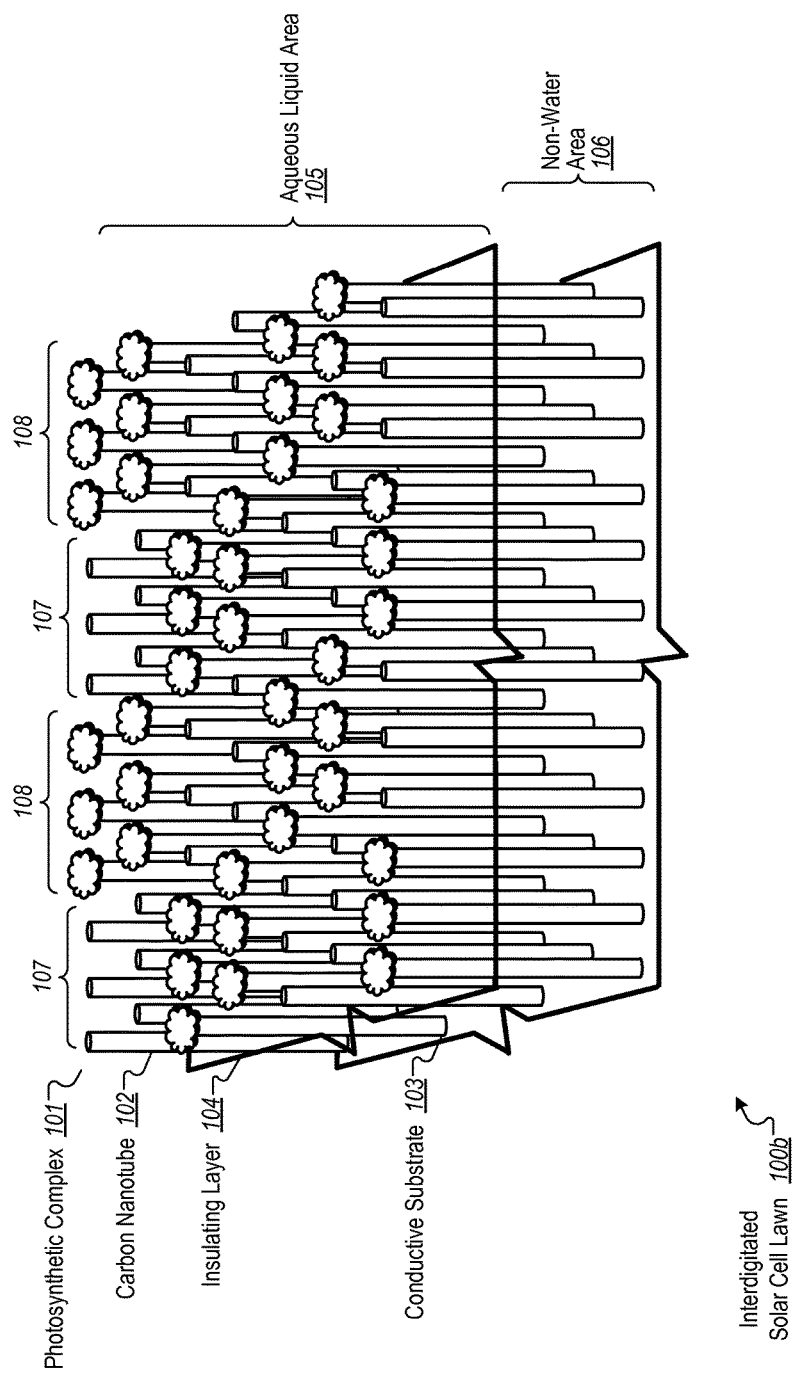

BIO-SOLAR CELLS

CROSS-REFERENCE TO RELATED APPLICATION

This application claims priority to U.S. Application Ser. No. 61/481,799 filed on May 3, 2011, entitled "Bio-Solar Cells," which is incorporated by reference herein in its entirety.

TECHNICAL FIELD

This invention relates to energy, and more particularly to bio-solar cells.

BACKGROUND

The world's population is consuming existing fossil fuels at a rapid and accelerating rate. High energy consumption and the ever-increasing global population are creating critical problems including dwindling fossil energy supplies and global climate change. Despite the rapid expansion of modern renewable energy technologies, these energy sources account for less than five percent of the energy used globally. Such energy sources typically produce lower to no air emissions, little or no solid wastes, and less land disruption compared to coal, natural gas, or nuclear power plants. Of the array of modern renewable energy sources currently available, photovoltaic technology has assumed a preeminent position as a cheap renewable source of clean energy.

SUMMARY

Provided herein is a bio-solar cell including: one or more photosynthetic complexes, wherein each photosynthetic complex includes one or more chlorophyll compounds and one or more components of Photosystem II; one or more carbon nanotubes upon which the one or more photosynthetic complexes are bound at a first region of the one or more carbon nanotubes; and a conductive substrate attached to a second region of the one or more carbon nanotubes. In some implementations, the bio-solar cell further includes an insulating layer between the first regions and the second regions. For example, the bio-solar cell can include an aqueous liquid (e.g., water) substantially surrounding the first region, wherein the insulating layer physically separates the conductive substrate from the aqueous liquid and wherein the aqueous liquid is contained within a substantially clear container. In some implementations, the first regions of the one or more carbon nanotubes protrude through the insulating layer.

The one or more chlorophyll compounds can be selected from the group consisting of: chlorophyll a, chlorophyll b, chlorophyll c1, chlorophyll c2, chlorophyll d, chlorophyll f, and combinations thereof. For example, the one or more chlorophyll compounds are selected from the group consisting of: chlorophyll a, chlorophyll b, and combinations thereof. In some implementations, at least one of the one or more chlorophyll compounds is synthetically prepared.

The one or more photosynthetic complexes can be covalently bound to the one or more carbon nanotubes. For example, two or more photosynthetic complexes are bound to a single carbon nanotube. In some implementations, the photosynthetic complexes further include one or more cofactors and/or antioxidants. The one or more components of Photosystem II can be isolated from the group consisting of bacteria, algae, cyanobacteria, and higher plants. For example, the one or more components of Photosystem II are isolated from tobacco plants.

The at least one of the one or more carbon nanotubes can include multi-walled nanotubes and/or single-walled nanotubes. In some implementations, the one or more carbon nanotubes are bound to the conductive substrate using an air-assisted chemical vapor deposition technique or other method. Two or more of the one or more carbon nanotubes can be aligned normal to the conductive substrate.

In some implementations, one or more of the carbon nanotubes bound to the conductive substrate is not bound to a photosynthetic complex. In some implementations, two or more of the carbon nanotubes that are not bound to a photosynthetic complex are grouped together. For example, the groups of unbound carbon nanotubes can be separated on the conductive substrate from groups of two or more of the carbon nanotubes that are bound to a photosynthetic complex. In some implementations, the separated groups of carbon nanotubes form an interdigitated pattern on the conductive substrate.

In some implementations, the conductive substrate is made with a material selected from the group consisting of gold, silver, graphene, and combinations thereof. In some implementations, the conductive substrate is flexible.

Also provided herein is a bio-solar cell including a plurality of carbon nanotubes bound to a conductive substrate, wherein one or more of the carbon nanotubes are bound at a first region to one or more photosynthetic complexes, wherein the photosynthetic complex includes one or more chlorophyll compounds and one or more components of Photosystem II.

In some implementations, a bio-solar cell includes a plurality of carbon nanotubes bound at a second region to a conductive substrate, wherein the carbon nanotubes and the conductive substrate are covered by an insulating layer, wherein the insulating layer includes one or more photosynthetic complexes including one or more chlorophyll compounds and one or more components of Photosystem II. In some implementations, the one or more photosynthetic complexes are bound to one or more of the carbon nanotubes.

Further provided herein is a bio-solar cell assembly including: a reflective material (e.g., MYLAR®); one or more fiber optic bundles; and one or more bio-solar cells as described herein; wherein the reflective material is configured to direct light to the one or more fiber optic bundles; and wherein the one or more fiber optic bundles are configured to redirect the light received from the reflective material to the one or more bio-solar cells. In some implementations, the bio-solar cell assembly further includes a container to contain the one or more bio-solar cells.

A method for converting light to energy is also provided herein, the method including: receiving light at one or more photosynthetic complexes, wherein each photosynthetic complex includes one or more chlorophyll compounds and one or more components of Photosystem II enabled to convert light to energy; transferring the energy to a first region of one or more carbon nanotubes; conducting the energy along the length of the one or more carbon nanotubes; and receiving the energy in a conductive substrate attached to a second region of the one or more carbon nanotubes.

In some implementations, the method further includes: insulating, using an insulating layer, the first region of the carbon nanotubes from the second region of the carbon nanotubes. For example, substantially surrounding the first region with an aqueous liquid; containing, using a substantially clear container, the aqueous liquid; and separating, using the insulating layer, the conductive substrate from the aqueous liquid.

In some implementations, the method further includes: directing, using a reflective material, light to one or more fiber optic bundles; and redirecting, using the one or more fiber optic bundles, the light directed from the reflective material to the one or more photosynthetic complexes.

Further provided herein is a system for converting light to energy including: one or more bio-solar cells, each bio-solar cell including: one or more photosynthetic complexes, wherein each photosynthetic complex includes one or more chlorophyll compounds and one or more components of Photosystem II, wherein the photosynthetic complexes are enabled to convert light to energy; one or more carbon nanotubes upon which the one or more photosynthetic complexes are attached at a first region of the one or more carbon nanotubes, wherein the carbon nanotubes are enabled to conduct energy received from the photosynthetic complexes; and a conductive substrate attached to a second region of the one or more carbon nanotubes, wherein the conductive substrate is enabled to receive energy conducted by the one or more carbon nanotubes.

Unless otherwise defined, all technical and scientific terms used herein have the same meaning as commonly understood by one of ordinary skill in the art to which this invention belongs. Although methods and materials similar or equivalent to those described herein can be used to practice the invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

These and other features, aspects and advantages of the present teachings will become better understood with reference to the following description, examples and appended claims.

DESCRIPTION OF DRAWINGS

FIG. 1B shows a perspective view of an interdigitated bio-solar cell lawn.

Like reference symbols in the various drawings indicate like elements.

DETAILED DESCRIPTION

Figure 1:
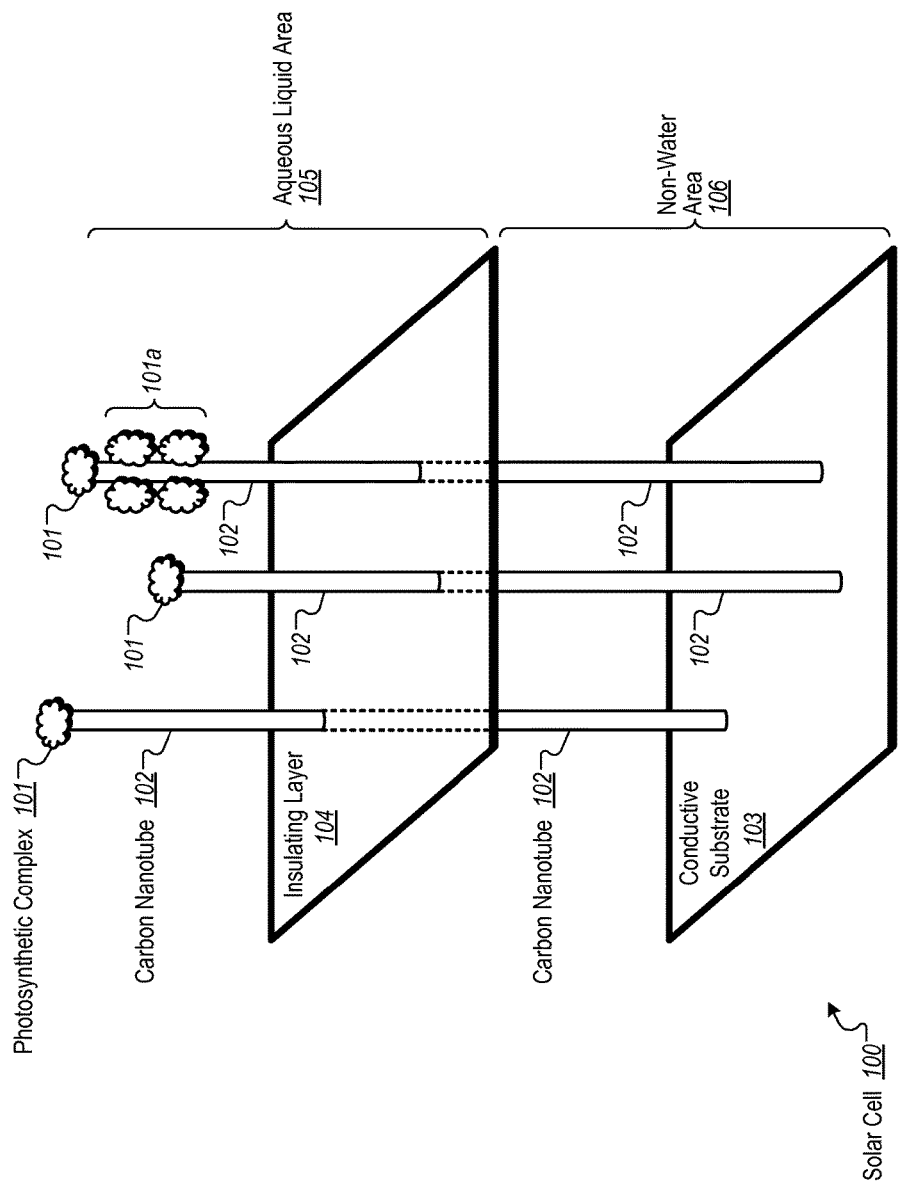
FIG. 1 shows a perspective view of a bio-solar cell.

FIG. 1 shows a perspective view of a bio-solar cell 100. The bio-solar cell 100 can be used to collect light energy from any light source, including the sun and other sources. In some implementations, the bio-solar cell 100 includes advantages of bio-solar systems. For example, the bio-solar cell 100 includes one or more photosynthetic complexes 101 that are bound (e.g., covalently or noncovalently) to a first region of the one or more carbon nanotubes 102 (e.g., as shown, on the top ends of the carbon nanotubes 102). See, for example, Quintiliani, M. et al., *Chem. Eur. J.* 2003 14: 3765-3775 and Carmeli, I. et al., *Adv. Mater.* 2007 19: 3901-3905. In some implementations, the one or more photosynthetic complexes 101 are covalently bound to the one or more carbon nanotubes 102 (e.g., one photosynthetic complex 101 bound to each carbon nanotube 102). In some implementations, the photosynthetic complexes 101 are noncovalently bound to the one or more carbon nanotubes 102. In some cases the photosynthetic complex and the carbon nanotubes are noncovalently bound to one another. Examples of noncovalent means for conjugation include, e.g., ionic bonding, hydrophobic interactions, ligand-nucleotide binding, chelating agent/metal ion pairs or specific binding pairs such as avidin/biotin, streptavidin/biotin, anti-fluorescein/fluorescein, anti-2,4-dinitrophenol (DNP)/DNP, anti-peroxidase/peroxidase, anti-digoxigenin/digoxigenin or, more generally, receptor/ligand. In some implementations, the photosynthetic complexes 101 are in close proximity to the carbon nanotubes 102, e.g., such that light energy that is received by the photosynthetic complex 101 is transferred to the carbon nanotube 102. In some implementations, one or more other layers (e.g., conductive or energy-transmitting layers) exist between the photosynthetic complexes 101 and the carbon nanotubes 102.

The photosynthetic complexes 101, for example, include one or more chlorophyll compounds and one or more components of Photosystem II. In some implementations, the chlorophyll compounds are selected from the group consisting of: chlorophyll a, chlorophyll b, chlorophyll c1, chlorophyll c2, chlorophyll d, chlorophyll f, and combinations thereof. In some implementations, the chlorophyll compounds that are used are chlorophyll a and/or chlorophyll b, which are abundant in some plants.

Chlorophyll as described herein can be isolated from any suitable variety of plant. Examples of plants include monocotyledonous and dicotyledonous plants, including a fodder or forage legume, ornamental plant, food crop, tree, or shrub selected from the following non-limiting list including maize, sweet potato, tubers such as cassarva, sugar beet, wheat, barley, rye, oat, rice, soybean, peanut, pea, cowpea, lentil and alfalfa, cotton, rapeseed, canola, pepper, sunflower, potato, tobacco, tomato, eggplant, trees such as eucalyptus and poplars, an ornamental plant, a perennial grass and a forage crop. In some implementations, chlorophyll is isolated from tobacco plants. Other sources of chlorophyll compounds include bacteria, algae, cyanobacteria, and other higher plants. Examples of algae include without limitation green algae e.g., *Chlamydomonas reinhardtii* and *Chlorella vulgaris*, and red algae e.g. *Cyanidium caldarium* and *Porphyridium purpureum*. In some implementations, the one or more chlorophyll compounds are prepared synthetically.

Photosystem II (or water-plastoquinone oxidoreductase) is the first protein complex in the light-dependent reactions involved in photosynthesis. Photosystem II is composed of 20 subunits as well as other accessory, light-harvesting proteins. Each photosystem II contains at least 99 cofactors including 35 chlorophyll a, 12 beta-carotene, two pheophytin, three plastoquinone, two heme, bicarbonate, 25 lipid, and seven n-dodecyl-beta-D-maltoside detergent molecules, the six components of the $Mn_4Ca$ cluster (including chloride ion), and one $Fe^{2+}$ and two putative $Ca^{2+}$ ion per monomer. The photosynthetic complexes described herein include one or more of these components sufficient to show photochemical activity. For example, one or more components of Photosystem II are chosen from: Photosystem II protein X PsbX, Photosystem II reaction center D1, Photosystem II manganese-stabilizing protein PsbO, Photosystem II 10 kDa phosphoprotein PsbH, Photosystem II reaction center N protein PsbN, Photosystem II protein PsbI, Photosystem II protein PsbK, Photosystem II stability/assembly factor, Photosystem II protein L PsbL, Photosystem II protein J PsbJ, Photosystem II reaction center T PsbT, Photosystem II chlorophyll a-binding protein CP47 homolog, Photosystem II protein M PsbM, Photosystem II protein Psb27, Photosystem II protein Y PsbY, Photosystem II reaction centre W protein, Photosystem TI protein P PsbP, Photosystem II reaction center D2, Photosystem II chlorophyll a-binding protein CP43 homolog, and combinations thereof.

Photosystem II is located in the thylakoid membrane of plants, algae, and cyanobacteria. It can be isolated from any suitable variety of plants, algae and/or cyanobacteria as described above. The one or more components used in the bio-solar cells as described herein are isolated using methods known to those of skill in the art. In some implementations, the one or more components of Photosystem II are prepared synthetically. See, for example U.S. 2010/0031395, which is incorporated in its entirety herein by reference.

In some implementations, photosynthetic complexes 101 include one or more cofactors for Photosystem II. For example, one or more cofactors are selected from ATP, NADPH, and glucose. In some implementations, photosynthetic complexes 101 include one or more antioxidants. For example, antioxidants can include NADH, NADPH, FADH2, FMNH2, FADH, and FMNH.

Although only three carbon nanotubes 102 are shown in FIG. 1, the bio-solar cell 100 includes any suitable number of carbon nanotubes 102 (e.g., 4, 5, 6, 7, 8, 9, tens, hundreds, thousands, or more). Further, each carbon nanotube 102 can have one or more photosynthetic complexes 101 on a first region (e.g., as shown the top ends) of the carbon nanotubes 102 that are able to receive light energy (e.g., from the sun). In some implementations, each carbon nanotube 102 includes at least one photosynthetic complex 101 bound to a region of each carbon nanotube 102. The regions of the carbon nanotube are selected from the ends, domains, and fractional portions of the carbon nanotubes. The first and second regions of the carbon nanotubes are situated such that the one or more photosynthetic complexes are separated from the conductive substrate. In some implementations, the at least one photosynthetic complex is bound at the end of a carbon nanotube 102. In some implementations, two or more photosynthetic complexes 101 are bound to the carbon nanotube 102, e.g., including one or more photosynthetic complexes 101a that are bound to the sides of the carbon nanotube 102. As shown in FIG. 1, the second region (e.g., the bottom end) of the carbon nanotubes 102 are attached to a conductive substrate 103 (e.g., made of gold, silver, graphene or some other conductive substance that has some flexibility).

In some implementations, the bio-solar cell 102 further includes an insulating layer 104. As shown in FIG. 1, for example, the insulating layer 104 can be between the first region and the second region of the carbon nanotubes 102. As shown in FIG. 1, the upper portion of the carbon nanotubes 102 can protrude through the insulating layer 104 by a sufficient amount so that sufficient area exists on the first region of the carbon nanotubes 102 for attaching the photosynthetic complexes 101.

In some implementations, the bio-solar cell 102 further includes an aqueous liquid (e.g., water or a water-based solution) in an aqueous liquid area 105. The aqueous liquid, for example, can substantially surround the first region of the carbon nanotubes 102 and their attached photosynthetic complexes 101. The insulating layer 104 physically separates the conductive substrate 103 from the aqueous liquid in the aqueous liquid area 105. To allow penetration of light to the photosynthetic complexes 101, the aqueous liquid can be contained within a substantially clear container. For example, the substantially clear container can include the insulating layer 104 and an attached clear film (e.g., plastic) that contains the aqueous liquid. A non-water area 106 (e.g., including air) can exist between the insulating layer 104 and the conductive substrate 103, preventing or inhibiting contact between the aqueous liquid and the conductive substrate 103.

Figure 1A:
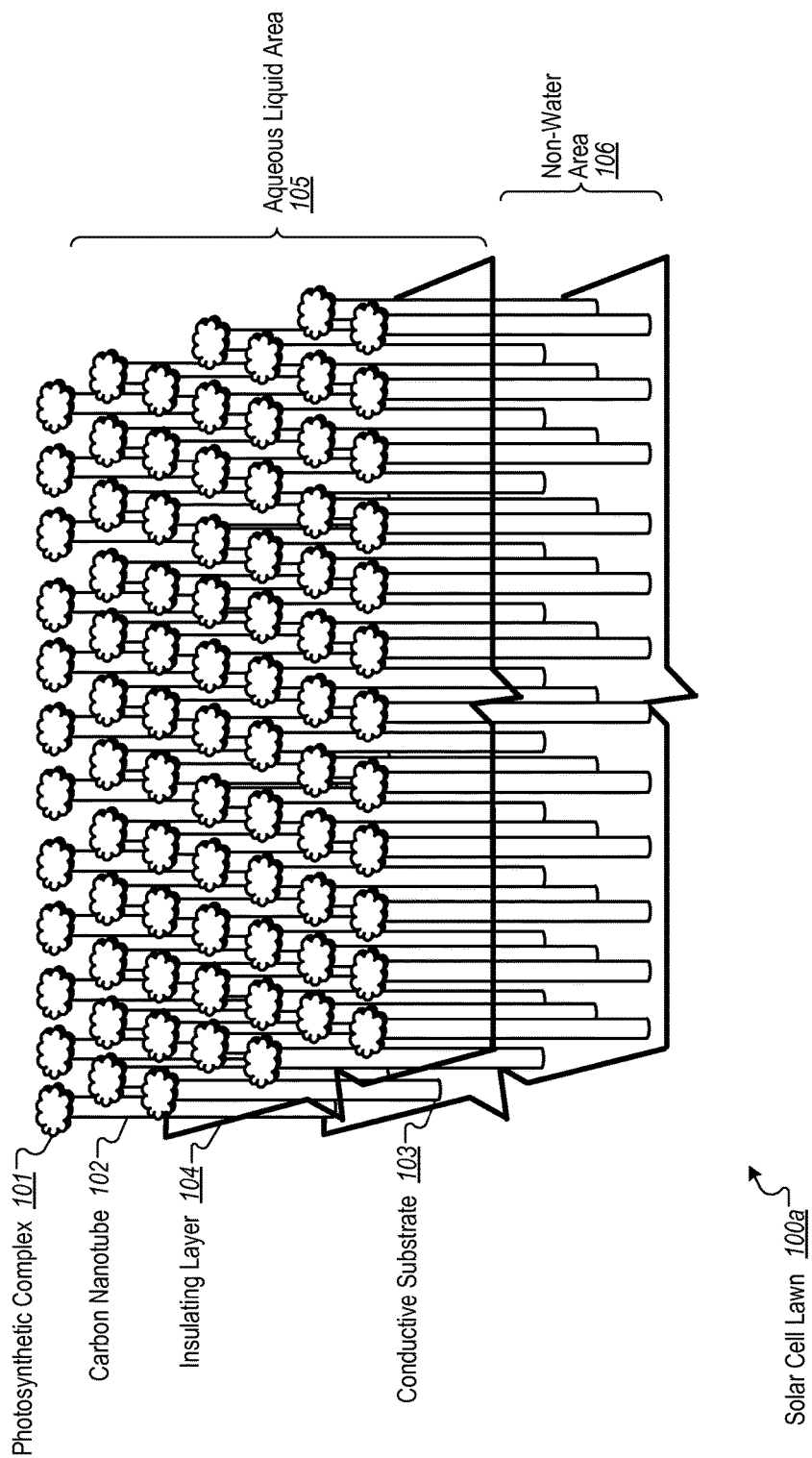
FIG. 1A shows a perspective view of a bio-solar cell lawn.

FIG. 1A shows a perspective view of a bio-solar cell lawn 100a. The bio-solar cell lawn 100a includes numerous photosynthetic complexes 101, each bound to a carbon nanotube 102. Because the bio-solar cell lawn 100a extends significantly in two dimensions, the bio-solar cell lawn 100a shown in FIG. 1A represents a small section of a vastly larger bio-solar cell lawn 100a, e.g., having dimensions of several feet in each of two directions. For example, the bio-solar cell lawn 100a can have the equivalent surface area of a football field and, because of its flexibility and thinness, can be contained (e.g., by rolling, folding, etc.) in a footprint of one meter in diameter by three meters high.

In some implementations, the carbon nanotubes 102 include single-walled nanotubes (SWNTs), each having a diameter of a few nanometers or smaller. In some implementations, the carbon nanotubes 102 include multi-walled nanotubes (MWNTs), e.g., tubes within tubes. In some implementations, the multi-walled tubes are grown using a variety of processes including, for example, high-temperature decomposition of hydrocarbons using metallic catalysts and grown in a reducing atmosphere. See, for example, Guldi, D. M., *Phys. Chem. Chem. Phys.* 2007 9: 1400-1420. In some implementations, the multi-walled nanotubes are easier to align into lawns (or forests) than single-walled nanotubes. The length of the carbon nanotubes 102 is sufficient to include one or more attached photosynthetic complexes 101, penetrate the insulating layer 104, and connect to the conductive substrate 103.

The bio-solar cells (e.g., bio-solar cells 100, 200) function to collect light energy in part because electron transfer occurs from the photosynthetic complex 101 through the water of the aqueous liquid area 105 to the carbon nanotubes 102, and from there transmitted to the conducting substrate 103. In some implementations, to complete the circuit, electrons are transferred back to the water. For example, the bio-solar cell can include another set of carbon nanotubes without the photosynthetic complex connected to the conducting substrate and immersed in the film of water. Since the two conducting substrates for the positive and negative terminals of the bio-solar cell must be isolated, the two sets of carbon nanotubes (photosynthetic complex bound and unbound) can be grown on separate, isolated conducting films (on the same substrate) arranged in an interdigitated pattern.

FIG. 1B shows a perspective view of an interdigitated bio-solar cell lawn 100b. For example, as shown in groups 107, one or more of the carbon nanotubes 102 that are bound to the conductive substrate 103 are not bound to a photosynthetic complex 101. However, as shown in groups 108, some of the carbon nanotubes 102 are bound to a photosynthetic complex 101, as described above. In some implementations, the groups 107 of unbound carbon nanotubes 102 are separated from the groups 108 to form an interdigitated pattern on the conductive substrate 103. Any suitable pattern can be used, for example, a striped or checked pattern.

There are various ways for growing forests of carbon nanotubes 102. See, for example, Gooding, J. J. et al., *JACS* 2003 125: 9006-9007. Regardless of the way that they are grown, the carbon nanotubes are aligned normal to the conductive substrate 103 on which they are formed. In some implementations, multiwall nanotubes are manufactured using processes that include high-temperature decomposition of hydrocarbons using metallic catalysts in a reducing atmosphere. In some implementations, single-walled carbon nanotubes 102 are manufactured and aligned into forests using a self-assembly method from solution. In some implementations, simple printing technologies are used to align forests of single-walled carbon nanotubes 102. In some implementations, growth catalysts are patterned on substrates to allow for the growth of densely packed aligned single-walled carbon nanotubes 102.

Figure 2:
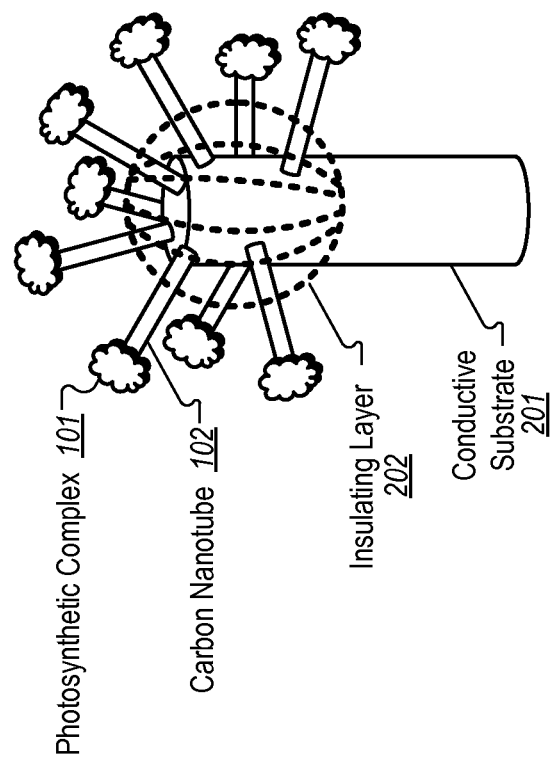
FIG. 2 shows an example bio-solar cell that includes carbon nanotubes bound to a cylindrical conductive substrate.

FIG. 2 shows an example bio-solar cell 200 that includes carbon nanotubes 102 bound to a cylindrical conductive substrate 201. The carbon nanotubes 102 protrude through an insulating layer 202 that separates the conductive substrate 201 from the photosynthetic complexes 101 at the first and second regions of the carbon nanotubes 102. For example, the insulating layer 202 can have a substantially spherical or oblong shape and substantially cover a first region of the conductive substrate 201. The photosynthetic complexes 101 of the bio-solar cell 200 include one or more chlorophyll compounds and one or more components of Photosystem II. In some implementations, an aqueous liquid (e.g., water or a water-based solution) substantially surrounds the first region of the carbon nanotubes 102 and their attached photosynthetic complexes 101. In some implementations, the aqueous liquid is contained by a substantially clear container, which allows penetration of light to the photosynthetic complexes 101.

Figure 2A:
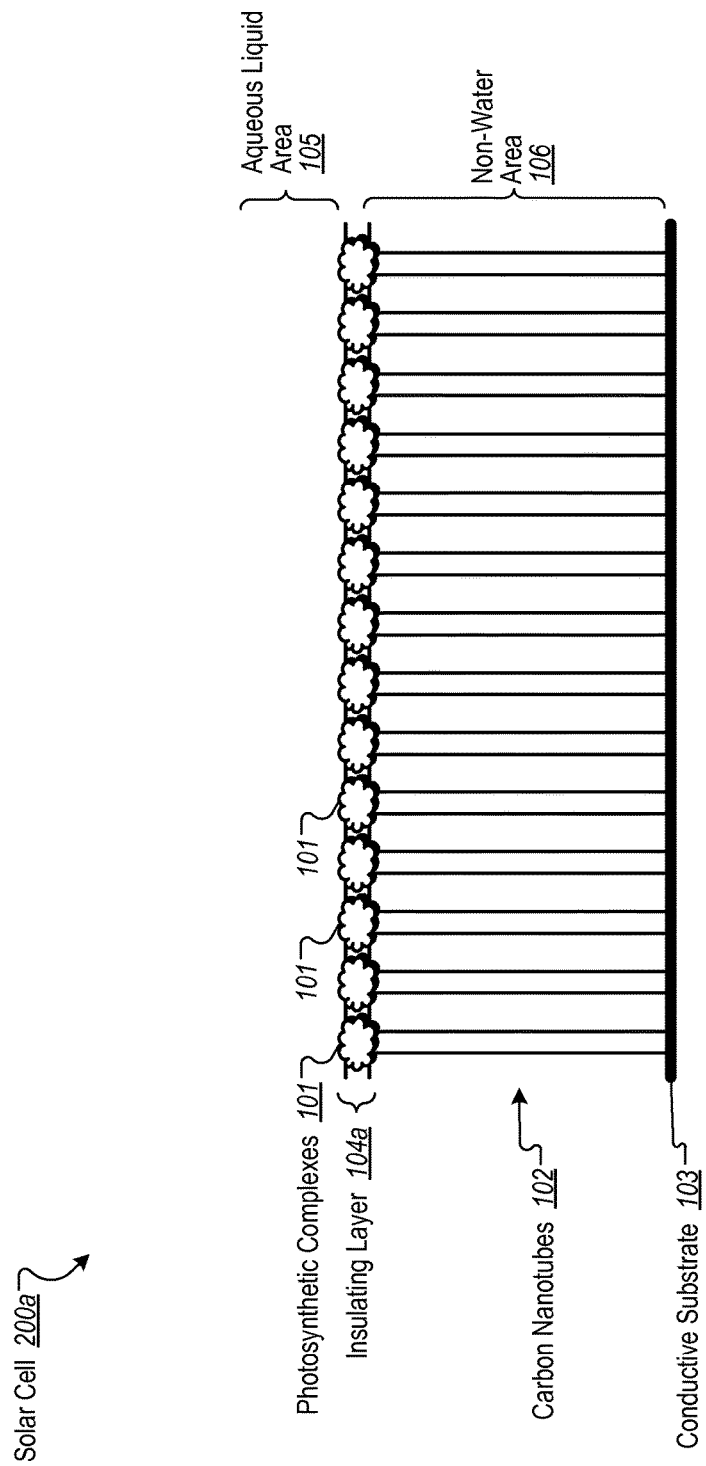
FIG. 2A shows an example bio-solar cell that has photosynthetic complexes in an insulating layer.

FIG. 2A shows an example bio-solar cell 200a that has photosynthetic complexes 101 in an insulating layer 104a. In this example, the photosynthetic complexes 101 are bound to the carbon nanotubes 102. In some implementations, a gap can exist between all or some of the carbon nanotubes 102 and the photosynthetic complexes 101. The carbon nanotubes 102 are attached to the conductive substrate 103 as described above.

Figure 3:
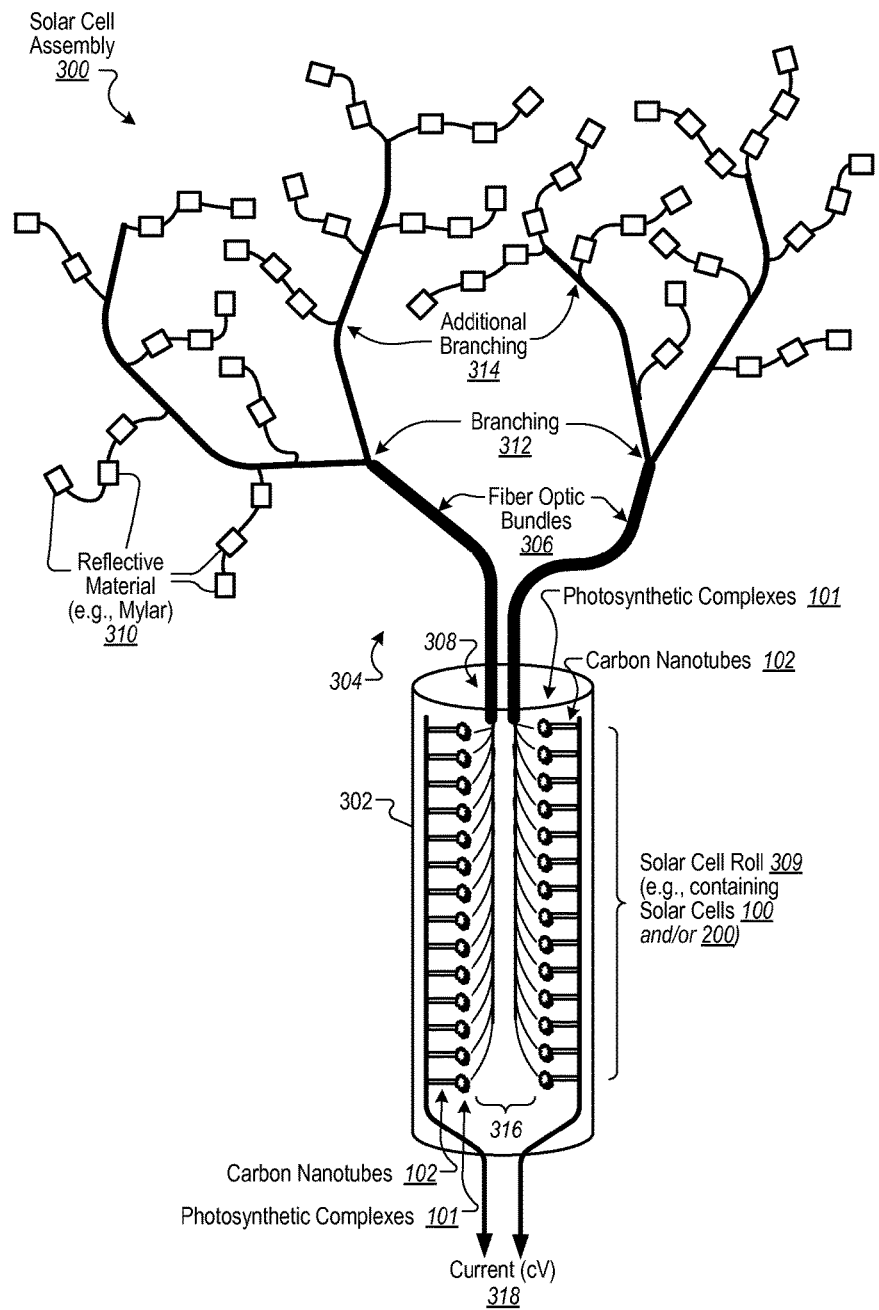
FIG. 3 shows an example bio-solar cell assembly.

FIG. 3 shows an example bio-solar cell assembly 300. In some implementations, the bio-solar cell assembly 300 includes a bio-solar cell container 302 that can house any combination of bio-solar cells (e.g., bio-solar cells 100, 200) described above with reference to FIGS. 1-2A. The bio-solar cell assembly 300 collects sunlight, for example, using a branch-shaped solar-collector 304. The solar-collector 304 includes one or more fiber optic bundles 306 that transfer collected light to the bio-solar cells (e.g., bio-solar cells 100, 200) through connections 308 in the top of the bio-solar cell container 302.

For example, the bio-solar cells in the bio-solar cell container 302 can be in the form of a bio-solar cell roll 309 (e.g., a tightly rolled-up, 60-foot strip of bio-solar cells). Ends of the fiber optic bundles 306 are separated and laid or woven throughout the carbon nanotubes 102 in the bio-solar cell roll 309. For example, the fibers can operate as light pipes that distribute sunlight received from the solar collector 304 to the photosynthetic complexes 101 in the bio-solar cell roll 309. The bio-solar cell roll 309, for example, can be three feet high and two feet in diameter. For example, if the container 302 is the size of a standard shipping drum, then the bio-solar cell roll 309 can fit inside, and the bio-solar cell container 302 can be sealed.

The solar-collector 304 can include leaves 310 that are made of a thin, low-cost, light-weight, highly reflective material (e.g., MYLAR® (biaxially oriented polyethylene terephthalate or boPET)) that is configured to direct light received by the one or more fiber optic bundles 306. For example, some of the leaves 310 can be at the ends of the individual fibers, and others of the leaves 310 can be along the lengths of the individual fibers. In some implementations, the solar-collector 304 is folded up for storage and transport. The solar collector 304 is manufactured to cover, with its leaves 310, as much surface area as possible in three dimensions in order to gather as much light as possible.

The ends of the fiber optic bundles 306 can be completely bundled at the point which the fiber optic bundles 306 attach to the bio-solar cell container 302 at connections 308. However, moving upward in the solar collector 304, the fiber optic bundles 306 are divided into sub-bundles, as shown at branching 312. The sub-bundles can also be divided into yet smaller sub-bundles, as shown at branching 314. Inside the bio-solar cell container 302, branching 316 shows how the fiber optic bundles 306 can be laid or woven throughout the carbon nanotubes 102 in the bio-solar cell roll 309 to provide light to the photosynthetic complexes 101.

Electrical current 318 is produced by the bio-solar cell assembly 300. In some implementations, the bottom of the bio-solar cell container 302 includes a quick-release connection point to which batteries can be attached to store energy, or equipment that runs on electricity can be plugged in. In some implementations, electrical current 318 is converted to hydrogen.

Figure 4:
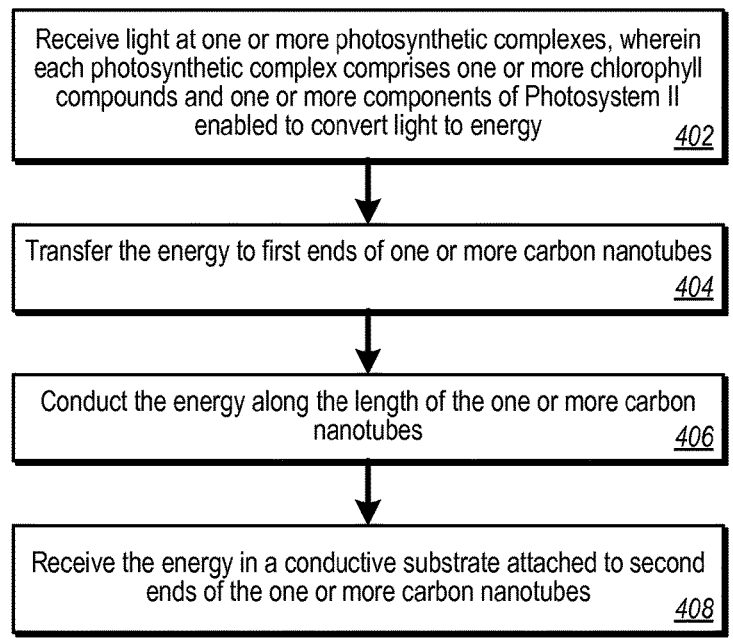
FIG. 4 is a flow diagram of an example process for using bio-solar cells.

FIG. 4 is a flow diagram of an example process 400 for using bio-solar cells. FIGS. 1-3, for example, are used to provide examples for the process 400.

Light is received at one or more photosynthetic complexes (402). Each photosynthetic complex includes one or more chlorophyll compounds and one or more components of Photosystem II that are enabled to convert light to energy. For example, photosynthetic complexes 101 of the bio-solar cell 100 absorb light energy, e.g., from the sun.

The energy is transferred to first region of one or more carbon nanotubes (404). As an example, energy absorbed by the photosynthetic complexes 101 can be transferred to the one or more carbon nanotubes 102 (e.g., in the form of excited electrons).

The energy is conducted along the length of the one or more carbon nanotubes (406). For example, energy can travel the length of the carbon nanotubes 102 from the region closest to the photosynthetic complexes 101 to the region of the carbon nanotubes 102 that are attached to the conductive substrate 103.

The energy is received in a conductive substrate attached to the second region of the one or more carbon nanotubes (408). As an example, the conductive substrate 103 can receive the energy from the carbon nanotubes 102.

In some implementations, an insulating layer is used to insulate the first region of the carbon nanotubes from the second region of the carbon nanotubes. For example, the insulating layer 104 can divide the regions of the carbon nanotubes 102 from each other, isolating the photosynthetic complexes 101 from the conductive substrate 103.

In some implementations, the first region is substantially surrounded with an aqueous liquid. As an example, the photosynthetic complexes 101 and the corresponding region of the carbon nanotubes 102 can be surrounded with water or a solution that includes water.

In some implementations, a substantially clear container is used to contain the aqueous liquid. For example, the water that surrounds the photosynthetic complexes 101 and the corresponding region of the carbon nanotubes 102 can be enclosed with a clear plastic film or another clear, flexible material that can allow light (e.g., sunlight) to reach the photosynthetic complexes 101.

In some implementations, the insulating layer is used to separate the conductive substrate from the aqueous liquid. As an example, the insulating layer 104 can form part of the containment system that holds the aqueous solution around the photosynthetic complexes 101 and the corresponding region of the carbon nanotubes 102.

In some implementations, a reflective material is used to direct light to one or more fiber optic bundles. For example, referring to FIG. 3, a reflective material 310 made of MYLAR® (biaxially oriented polyethylene terephthalate or boPET) or other reflective material reflects and directs the sunlight to individual fibers or branches in the branch-shaped solar-collector 304 including fiber optic bundles 306.

In some implementations, the one or more fiber optic bundles re-direct the light directed from the reflective material to the one or more photosynthetic complexes. As an example, the fiber optic bundles 306 can redirect the light to photosynthetic complexes 101 of bio-solar cells (e.g., bio-solar cells 100, 200, etc.) in the bio-solar cell roll 309.

A number of embodiments of the invention have been described. Nevertheless, it will be understood that various modifications may be made without departing from the spirit and scope of the invention. Accordingly, other embodiments are within the scope of the following claims.

What is claimed is:

1. A bio-solar cell comprising:
   one or more carbon nanotubes;
   one or more photosynthetic complexes, wherein each photosynthetic complex consists of one or more chlorophyll compounds, one or more components of Photosystem II, one or more cofactors and one or more antioxidants, and each photosynthetic complex is bound to an exterior surface of one of the one or more carbon nanotubes;
   a conductive substrate attached to each of the one or more carbon nanotubes; and
   an insulating layer between the conductive substrate and the one or more photosynthetic complexes, and
   wherein the bio-solar cell directly converts light to electrical energy.

2. The bio-solar cell of claim 1, wherein the bio-solar cell further comprises an aqueous liquid substantially surrounding the one or more photosynthetic complexes, the insulating layer physically separates the conductive substrate from the aqueous liquid, and the aqueous liquid is contained within a substantially clear container.

3. The bio-solar cell of claim 1, wherein each photosynthetic complex is covalently bound to one of the one or more carbon nanotubes.

4. The bio-solar cell of claim 1, wherein the conductive substrate is made of a material selected from the group consisting of gold, silver, graphene, and combinations thereof.

5. The bio-solar cell of claim 2, wherein the aqueous liquid is water.

6. The bio-solar cell of claim 1, wherein at least one of the one or more carbon nanotubes is a multi-walled carbon nanotube.

7. The bio-solar cell of claim 1, wherein at least one of the one or more carbon nanotubes is a single-walled carbon nanotube.

8. The bio-solar cell of claim 1, wherein the bio-solar cell comprises two or more carbon nanotubes, and at least two of the two or more carbon nanotubes are aligned normal to the conductive substrate.

9. The bio-solar cell of claim 1, wherein the conductive substrate is flexible.

10. The bio-solar cell of claim 1, wherein the one or more chlorophyll compounds are selected from the group consisting of: chlorophyll a, chlorophyll b, chlorophyll c1, chlorophyll c2, chlorophyll d, chlorophyll f, and combinations thereof.

11. The bio-solar cell of claim 10, wherein the one or more chlorophyll compounds are selected from the group consisting of: chlorophyll a, chlorophyll b, and combinations thereof.

12. The bio-solar cell of claim 11, wherein at least one of the one or more chlorophyll compounds is synthetically prepared.

13. The bio-solar cell of claim 1, wherein the one or more components of Photosystem II are isolated from the group consisting of bacteria, algae, cyanobacteria, and higher plants.

14. The bio-solar cell of claim 13, wherein the one or more components of Photosystem II are isolated from tobacco plants.

15. The bio-solar cell of claim 1, wherein at least one of the one or more carbon nanotubes attached to the conductive substrate is not bound to one of the one or more photosynthetic complexes.

16. The bio-solar cell of claim 15, wherein two or more of the carbon nanotubes are not bound to a photosynthetic complex and are grouped together to form a group of unbound carbon nanotubes.

17. The bio-solar cell of claim 16, wherein the group of unbound carbon nanotubes is separated on the conductive substrate from the one or more carbon nanotubes that are bound to a photosynthetic complex.

18. The bio-solar cell of claim 17, wherein the separated carbon nanotubes form an interdigitated pattern on the conductive substrate of alternating bound and unbound groups of carbon nanotubes.

19. A method for converting light to electrical energy in a bio-solar cell, the method comprising:
   providing one or more carbon nanotubes;
   receiving light at one or more photosynthetic complexes, wherein each photosynthetic complex consists of one or more chlorophyll compounds, one or more components of Photosystem II, one or more cofactors and one or more antioxidants, wherein each photosynthetic complex is bound to an exterior surface of a first region of one of the one or more carbon nanotubes and converts the light to electrical energy;
   transferring the electrical energy to the first region of each carbon nanotube;
   conducting the electrical energy along the length of each carbon nanotube; and
   receiving the electrical energy in a conductive substrate attached to a second region of each carbon nanotube, wherein an insulating layer separates the first and second regions of each carbon nanotube.

20. The method of claim 19, further comprising: substantially surrounding the one or more photosynthetic complexes with an aqueous liquid using a substantially clear container, and separating, using the insulating layer, the conductive substrate from the aqueous liquid.

21. The method of claim 19, further comprising:
directing, using a reflective material, light to one or more fiber optic bundles; and redirecting, using the one or more fiber optic bundles, the light directed from the reflective material to the one or more photosynthetic complexes.

22. A system for converting light directly to electrical energy, the system comprising:
one or more bio-solar cells, each bio-solar cell comprising:
one or more carbon nanotubes;
one or more photosynthetic complexes, wherein each photosynthetic complex consists of one or more chlorophyll compounds, one or more components of Photosystem II, one or more cofactors and one or more antioxidants, wherein each of the photosynthetic complexes convert light to electrical energy, and each photosynthetic complex is bound to an exterior surface of one of the one or more carbon nanotubes;
a conductive substrate attached to each of the one or more carbon nanotubes, wherein the conductive substrate receives electrical energy conducted by each of the one or more carbon nanotubes; and
an insulating layer between the conductive substrate and the one or more photosynthetic complexes.

23. The bio-solar cell of claim 1, wherein at least one of the one or more photosynthetic complexes is bound externally to an end of one of the one or more carbon nanotubes.

24. The system of claim 22, wherein at least one of the one or more photosynthetic complexes is bound externally to an end of one of the one or more carbon nanotubes.

* * * * *